United States Patent
Morici et al.

(10) Patent No.: US 9,970,982 B2
(45) Date of Patent: May 15, 2018

(54) APPARATUS AND A METHOD FOR PROVIDING AN OUTPUT PARAMETER AND A SENSOR DEVICE

(71) Applicant: Infineon Technologies AG, Neubiberg (DE)

(72) Inventors: Andrea Morici, Munich (DE); Harald Witschnig, Landskron (AT)

(73) Assignee: Infineon Technologies AG, Neubiberg (DE)

( * ) Notice: Subject to any disclaimer, the term of this patent is extended or adjusted under 35 U.S.C. 154(b) by 149 days.

(21) Appl. No.: 14/882,050

(22) Filed: Oct. 13, 2015

(65) Prior Publication Data
US 2016/0103173 A1    Apr. 14, 2016

(30) Foreign Application Priority Data
Oct. 14, 2014    (DE) .................. 10 2014 114 877

(51) Int. Cl.
*G01R 31/28* (2006.01)
*G01R 31/00* (2006.01)
*G01R 31/3187* (2006.01)

(52) U.S. Cl.
CPC ....... *G01R 31/2829* (2013.01); *G01R 31/006* (2013.01); *G01R 31/3187* (2013.01)

(58) Field of Classification Search
USPC ............................................ 324/76.11, 73.1
See application file for complete search history.

(56) References Cited

U.S. PATENT DOCUMENTS

| | | | |
|---|---|---|---|
| 2004/0219881 A1* | 11/2004 | Kramp | H04M 1/6075 455/41.2 |
| 2005/0017702 A1* | 1/2005 | Kernahan | H02M 3/157 323/282 |
| 2006/0212764 A1* | 9/2006 | Slobodnik | G11C 29/16 714/718 |
| 2010/0145660 A1 | 6/2010 | Lang et al. | |
| 2013/0200909 A1 | 8/2013 | Rasbornig et al. | |
| 2015/0108971 A1* | 4/2015 | Granig | G01R 33/091 324/252 |

FOREIGN PATENT DOCUMENTS

| | | |
|---|---|---|
| DE | 102009047665 A1 | 7/2010 |
| DE | 102014103556 A1 | 9/2014 |

* cited by examiner

*Primary Examiner* — Vincent Q Nguyen
(74) *Attorney, Agent, or Firm* — Harrity & Harrity, LLP

(57) ABSTRACT

An apparatus for providing an output parameter includes an output parameter generator circuit configured to determine a value of an output parameter repeatedly. The output parameter generator circuit includes at least one circuit block mandatory for the determination of a value of the output parameter. Further, the apparatus includes an output interface circuit configured to transmit the output parameter repeatedly to a receiver and a test circuit configured to test a basic functionality of the at least one mandatory circuit block of the output parameter generator circuit repeatedly. The at least one mandatory circuit block of the output parameter generator circuit is unavailable for the determination of a value of the output parameter during the basic functionality test.

20 Claims, 8 Drawing Sheets

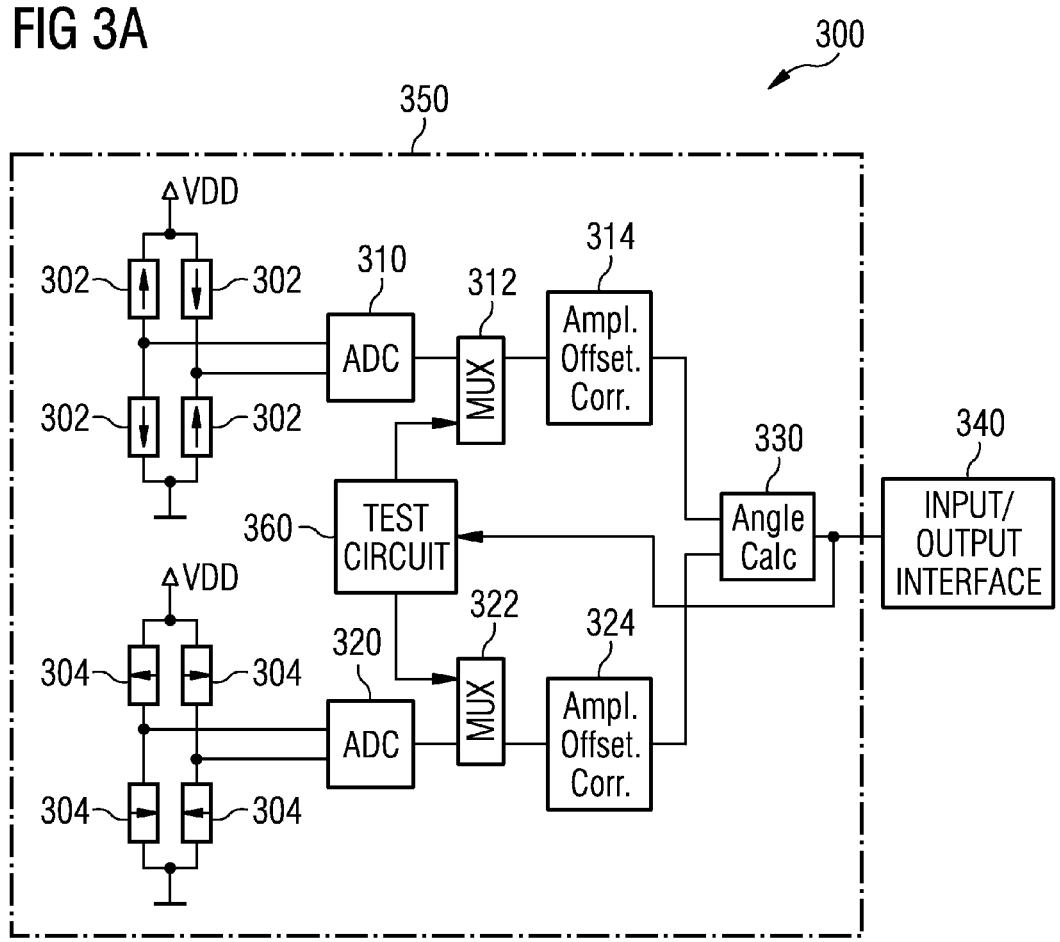

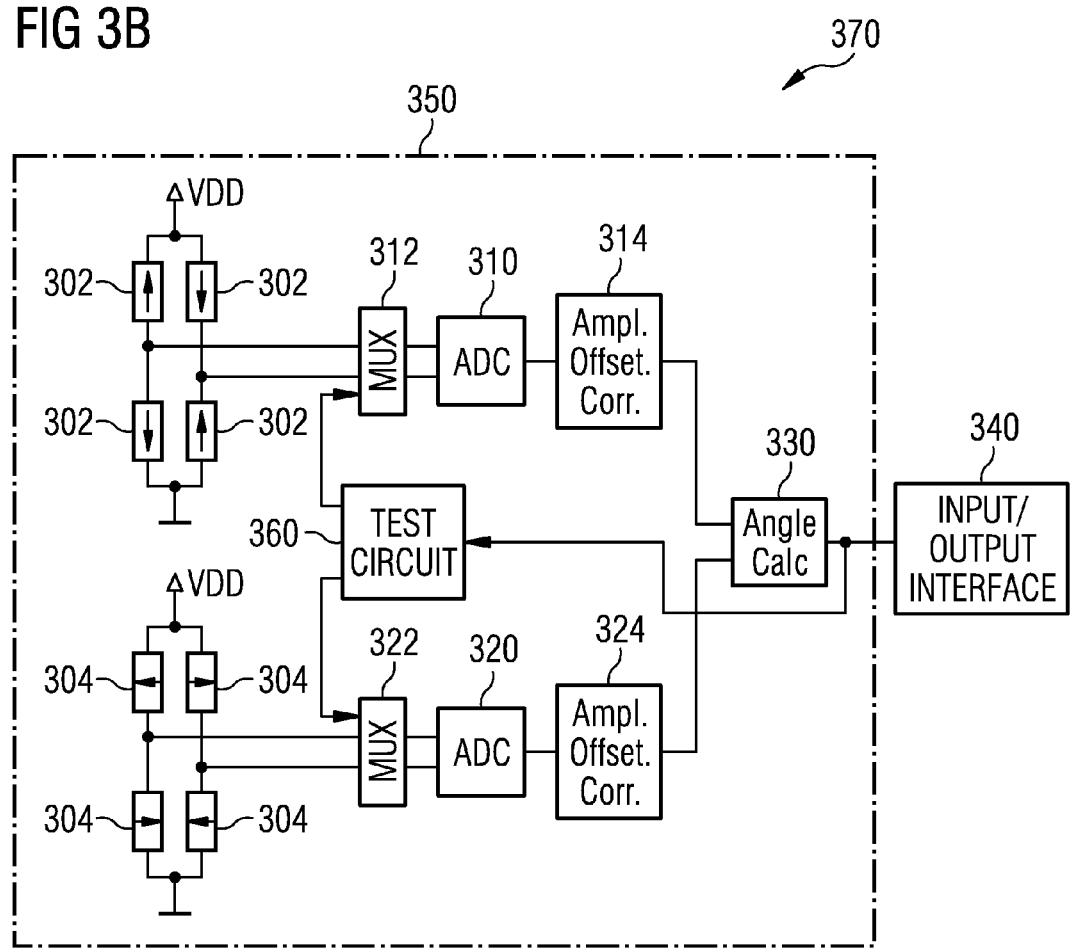

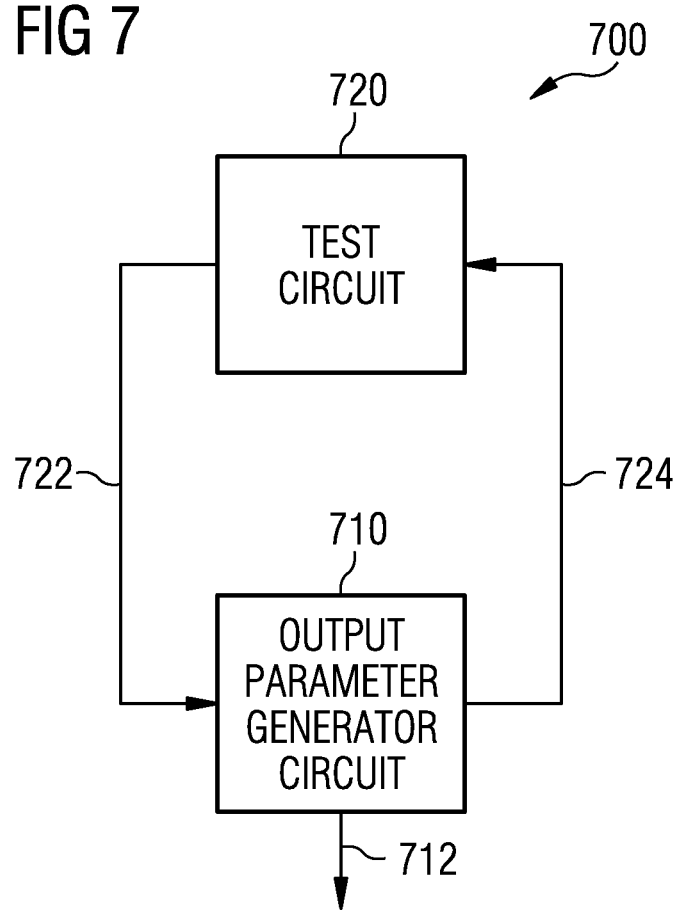

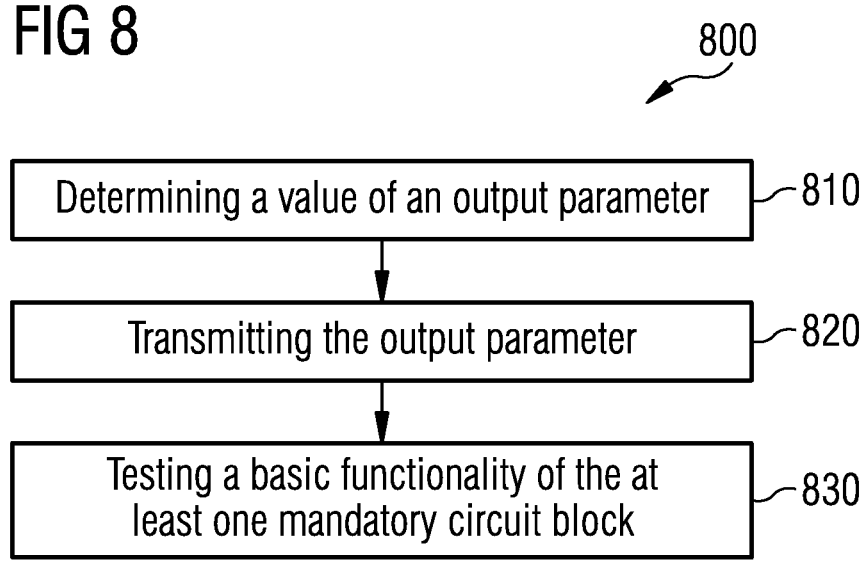
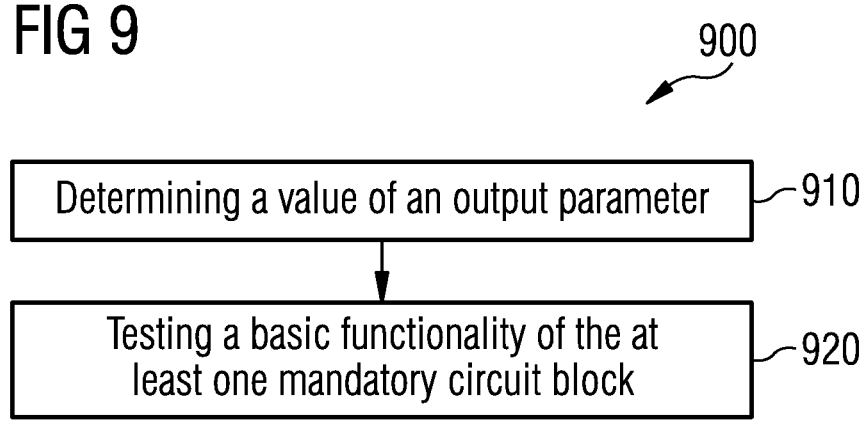

APPARATUS AND A METHOD FOR PROVIDING AN OUTPUT PARAMETER AND A SENSOR DEVICE

RELATED APPLICATION

This application claims priority under 35 U.S.C. § 119 to German Patent Application No. 102014114877.0, filed on Oct. 14, 2014, the content of which is incorporated by reference herein in its entirety.

TECHNICAL FIELD

Embodiments relate to test concepts for electrical devices and in particular to an apparatus and a method for providing an output parameter and a sensor device.

BACKGROUND

Many applications for electronic devices rely on a high reliability and availability of the electronic devices. Modern automotive applications demand safety complaint ICs (integrated circuits) to be used in automotive systems. Accordingly with the actual reference standard ISO 26262, the chip must be identified in an ASIL (Automotive Safety Integrity Level), thus satisfying a set of rules during the safety lifecycle process and implementing a set of safety mechanisms to ensure its reliability in case of fault. The ISO 26262 dictates the procedure to produce ASIL parts, components or entire systems.

High level of safety is requested in angle sensing applications, for example, thus angle sensor ICs must deal, beside technical requirements, with safety requirements and fully satisfy them. If on one hand the ISO development process can assure the compliance to safety, on the other hand the hardware metrics of the chip address it to an ASIL classification. The higher is the classification the safer is the IC, exploiting the open of a broader market and of a set of applications. Reaching the highest metrics is often a challenge due to design factors that impact the metric calculation.

To a higher metric classification a lower number of Failures In Time (FIT) is associated. The FIT is a temporal hardware failure identifier and it is dependent on the area of the chip and on the number of residual faults. The residual faults FITs can be lowered applying safety mechanisms on the chip blocks to secure them. The mechanisms can be both internal to the chip, representing internal features that reveal faulty blocks, or external to the chip, in the form of external measures.

To achieve a high ASIL level, the Single-Point Fault Metric (SPFM) as well as the Latent Fault Metric (LFM) have to reach high values (e.g. >95%), for example. The achievement of a high SPFM depends on mechanisms executed during operation. On the other hand, the LFM is strongly linked to safety mechanisms which are carried out at the startup of the IC (start-up BISTs, start-up built-in self-test).

SUMMARY

Some embodiments relate to an apparatus for providing an output parameter. The apparatus comprises an output parameter generator circuit configured to determine a value of an output parameter repeatedly. The output parameter generator circuit comprises at least one mandatory circuit block mandatory for the determination of a value of the output parameter. Further, the apparatus comprises an output interface circuit configured to transmit the output parameter repeatedly to a receiver and a test circuit configured to test a basic functionality of the at least one mandatory circuit block of the output parameter generator circuit repeatedly. The at least one mandatory circuit block of the output parameter generator circuit is unavailable for the determination of a value of the output parameter during the basic functionality test.

Some embodiments relate to an apparatus for providing an output parameter. The apparatus comprises an output parameter generator circuit configured to determine a value of an output parameter. The output parameter generator circuit comprises at least one mandatory signal path for the determination of a value of the output parameter. Further, the apparatus comprises a test circuit configured to test a basic functionality of the at least one mandatory signal path of the output parameter generator circuit repeatedly by providing input test data to an input of the mandatory signal path and analyzing output test data caused by the input test data and received from an output of the mandatory signal path. The test circuit is configured to execute the basic functionality test repeatedly after a predefined number of values of the output parameter are determined, at equal time intervals or after receiving a trigger from an external control unit.

BRIEF DESCRIPTION OF THE FIGURES

Some embodiments of apparatuses and/or methods will be described in the following by way of example only, and with reference to the accompanying figures, in which

FIG. 3a shows a block diagram of a sensor device;

FIG. 3b shows a block diagram of another sensor device;

FIG. 7 shows a block diagram of an apparatus for providing an output parameter;

FIG. 8 shows a flow chart of a method for providing an output parameter; and

FIG. 9 shows a flow chart of another method for providing an output parameter;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
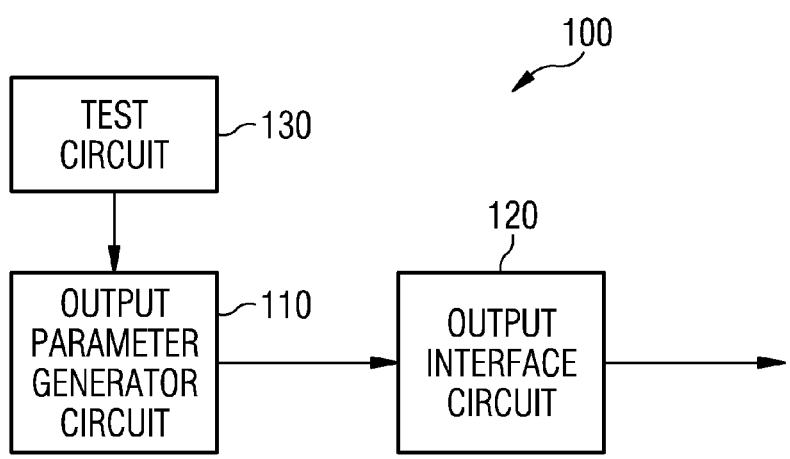
FIG. 1 shows a block diagram of an apparatus for providing an output parameter.

FIG. 1 shows a block diagram of an apparatus for providing an output parameter according to an embodiment. The apparatus 100 comprises an output parameter generator circuit 110 connected to an output interface circuit 120 and a test circuit 130 connected to the output parameter generator circuit 110. The output parameter generator circuit 110 determines a value of an output parameter repeatedly. The output parameter generator circuit 110 comprises at least one mandatory circuit block for the determination of a value of the output parameter. Further, the output interface circuit 120 transmits the output parameter repeatedly to a receiver. The test circuit 130 tests a basic functionality of the at least one mandatory circuit block of the output parameter generator circuit 110 repeatedly. The at least one mandatory circuit block of the output parameter generator circuit 110 is unavailable for the determination of a value of the output parameter during the basic functionality test.

By executing a basic functionality test repeatedly, the reliability and/or the availability of the determination of the output parameter may be increased. The repetition of the basic functionality test may reduce the Latent Fault Metric (LFM), for example.

The output parameter generator circuit 110 determines repeatedly a value of an output parameter, which can be transmitted to an external receiver by the output interface circuit 120. The output parameter may be a quantity (e.g. an angle, a temperature, a pressure) to be measured or derived from one or more measured physical quantities (e.g. magnetic field). The value of the output parameter may be a magnitude and/or direction (e.g. of a magnetic field) and/or a phase of the quantity and may vary over time.

The output parameter generator circuit 110 may determine values of the output parameter periodically (e.g. controlled by an internal clock signal) or in response to an external trigger signal (e.g. received from an external control unit).

The output parameter generator circuit 110 may comprise several circuit blocks for determining a value of the output parameter. For example, the output parameter generator circuit 110 may comprise one or more sensing elements or sensing circuits, one or more analog-to-digital convertor circuits, a clock signal generator module, one or more analog and/or digital filter circuits, a digital signal processing circuit and/or a microprocessor circuit. One or more of the circuit blocks of the output parameter generator circuit 110 may be mandatory or necessary for the determination of a value of the output parameter. In other words, the output parameter generator circuit 110 may be unable to determine a value of the output parameter without the one or more mandatory circuit blocks available for the determination of a value of the output parameter.

The test of the basic functionality of the at least one mandatory circuit block is also referred to as basic functionality test. The basic functionality test may be a test procedure applied at least to the at least one mandatory circuit block of the output parameter generator circuit 110 which occupies the at least one mandatory circuit block, so that the at least one mandatory circuit block is not available for the determination of a value of the output parameter during the basic functionality test. A circuit block of the output parameter generator circuit 110 mandatory for the determination of a value of the output parameter may be in the following referred to as mandatory circuit block. For example, the basic functionality test may be a repetition of a built-in self-test or a part of a built-in self-test executed during the start-up of the apparatus 100 or a device (e.g. sensor device) comprising the apparatus 100. The basic functionality test may be a test procedure testing at least a part of a signal path mandatory or required for the determination of a value of the output parameter. The basic functionality test may be more extensive than a run time test. In comparison, a run time test may be executable during the determination of a value of the output parameter also.

For example, the test circuit 130 may execute the basic functionality test at times at which a determination of a value of the output parameter is not requested or necessary (e.g. during the transmission or storing of a previously determined value of the output parameter).

The output interface circuit 120 transmits determined values of the output parameter to an external receiver. The output interface circuit 120 may use a wireless or a wired communication for the transmission of the output parameter (e.g. determined angle, a measured temperature, a measured pressure, a measured magnetic field, result of a calculation). For example, the output interface circuit 120 may transmit the output parameter based on a short pulse width modulation code protocol (SPC protocol), PSI3 (Peripheral Sensor Interface 3), PSI5 (Peripheral Sensor Interface 5), SENT (Single Edge Nibble Transmission) or another communication protocol (e.g. CAN (Controller Area Network), LIN (Local Interconnect Network), FlexRay, Ethernet, Media Oriented Systems Transport (MOST), Bluetooth, ZigBee, WiFi, Long Term Evolution (LTE), Universal Mobile Telecommunications System (UMTS)).

The output interface circuit 120 may transmit each value of the output parameter determined by the output parameter generator circuit 110. Alternatively, the output parameter generator circuit 110 may determine a value of the output parameter more often than the output interface circuit 120 transmits a value of the output parameter. For example, the output parameter generator circuit 110 may determine a value of the output parameter based on an internal clock signal and the output interface circuit 120 may output every n-th value (e.g. every value, every second value, every third value, every tenth value or another integer number) of the output parameter or may output a value of the output parameter, if requested by an external control unit only.

For example, the test circuit 130 may execute the basic functionality test during the transmission of the output parameter and/or directly after the determination of a value of the output parameter and before the determination of a succeeding value of the output parameter. In this way, dead times may be used for executing test procedures to increase the reliability and/or the availability of the apparatus 100.

Optionally, the test circuit 130 may execute the basic functionality test repeatedly after a predefined number (e.g. after every, every second value, every third value, every tenth value or another integer number) of values of the output parameter are transmitted. It may be sufficient to repeat the basic functionality test every n-th transmission of the output parameter to improve the reliability and/or the availability of the apparatus significantly. Alternatively or additionally, the test circuit 130 may execute the basic functionality test repeatedly at equal time intervals. For example, the test circuit 130 may execute the basic functionality test at repeated time intervals. The repeated time intervals may comprise a length between 1 ms and 50 ms (or between 2 ms and 20 ms or between 5 ms and 10 ms, e.g. 1 ms, 5 ms, 10 ms or 20 ms).

In comparison to a start-up test, which is executed only once after turning the power for the apparatus ON, the basic functionality test may be repeated while the apparatus 100 is in a power-on state. For example, the test circuit 130 may test a basic functionality of the at least one mandatory circuit block of the output parameter generator circuit 110 repeatedly while the apparatus is in an uninterrupted power-on state.

Optionally, the test circuit 130 tests additionally a run time functionality of the at least one mandatory circuit block of the output parameter generator circuit 110 repeatedly. The at least one mandatory circuit block of the output parameter generator circuit 110 may be available for the determination of a value of the output parameter during the run time functionality test. The run time functionality test may be less extensive than the basic functionality test. For example, the run time functionality test may analyze an output signal of the at least one mandatory circuit block during the determination of the value of the output parameter. The run time functionality test may reduce the Single-Point Fault Metric (SPFM), for example.

For example, the output parameter generator circuit 110 may comprise at least one mandatory signal path for the determination of a value of the output parameter. The test circuit 130 may test the basic functionality of the at least one mandatory signal path of the output parameter generator circuit 110 by providing input test data (e.g. test signal or test vector) to an input of the at least one mandatory signal path. For example, the at least one mandatory circuit block may be part of the at least one mandatory signal path. The test circuit 130 may analyze output test data (e.g. output signal or output vector) caused by the input test data and received from an output of the mandatory signal path. For example, the test circuit 130 may compare the output test data with reference test data (e.g. reference signal or reference output vector) or may compare output test date received from a first signal path or during a first time interval with output test date received from a different second signal path or during a different second time interval. In this way, the test circuit 130 may detect an erroneous behavior of the output parameter generator circuit 110.

The test circuit 130 may generate an error signal indicating an erroneous behavior of the output parameter generator circuit 110 based on the basic functionality test. For example, the error signal may be provided to an internal or external control module configured to switch the apparatus 100 into a state of reduced functionality, a safe-state or configured to stop using the transmitted output parameter or issue a warning.

Optionally, additionally or alternatively to one or more of the aspects mentioned above, the apparatus may comprise an input interface circuit (not shown) configured to receive a trigger signal. For example, the output interface circuit 130 may transmit the output parameter based on (e.g. in response to) the trigger signal. The input interface circuit and the output interface circuit 130 may be independent circuits or part of an input-output interface circuit. For example, the input-output interface circuit may receive and transmit signals based on a short pulse width modulation code protocol or another protocol.

Optionally, the input interface circuit may receive the trigger signal through a common transmission line and the output interface circuit may transmit the output parameter through the common transmission line. In other words, the input interface circuit and the output interface circuit may use the same transmission line. Alternatively, the input interface circuit and the output interface circuit may use different transmission lines.

Optionally, the apparatus 100 may switch off one or more circuit blocks (e.g. analog circuit blocks of the apparatus, if digital blocks are tested) during the execution of the basic functionality test. In this way, the power consumption of the apparatus 100 may be reduced.

The output parameter generator circuit 110, the output interface circuit 120 and the test circuit 130 and/or other optional modules may be independent hardware units or part of a computer, a digital signal processor or a microcontroller, for example. The output parameter generator circuit 110, the output interface circuit 120 and the test circuit 130 and/or other optional components may be implemented independently from each other or may be realized at least partly together (e.g. on the same die). For example, the output parameter generator circuit 110, the output interface circuit 120 and the test circuit 130 may be implemented or formed on a common semiconductor die.

Some embodiments relate to a sensor device comprising an apparatus according to one of the embodiments or aspects mentioned above (e.g. FIG. 1) or below (e.g. 3a, 3b, 3c or 7). For example, the output parameter generator circuit may comprise a sensor circuit configured to output a sensor signal indicating a magnitude of a physical quantity (e.g. magnetic field or pressure) to be sensed. Further, the output parameter generator circuit may determine a value of the output parameter (e.g. angle, rotation speed or measured pressure) based on the sensor signal.

For example, the output parameter generator circuit may comprise a sensor circuit outputting a sensor signal indicating a magnitude and/or direction (e.g. of a magnetic field) and/or a phase of a physical quantity to be sensed. Further, the output parameter generator circuit may comprise an analog-to-digital converter generating a digital sensor signal based on the sensor signal provided by the sensor circuit. Additionally, the output parameter generator circuit may comprise filter circuitry generating a filtered sensor signal based on the digital sensor signal. Further, the output parameter generator circuit may comprise an output parameter determiner providing a value of the output parameter to the output interface circuit based on the filtered sensor signal.

For example, the analog-to-digital converter, the filter circuitry and the output parameter determiner may be mandatory circuit blocks of the output parameter generator circuit. The test circuit may test a basic functionality of the analog-to-digital converter, the filter circuitry and/or the output parameter determiner.

Figure 2:
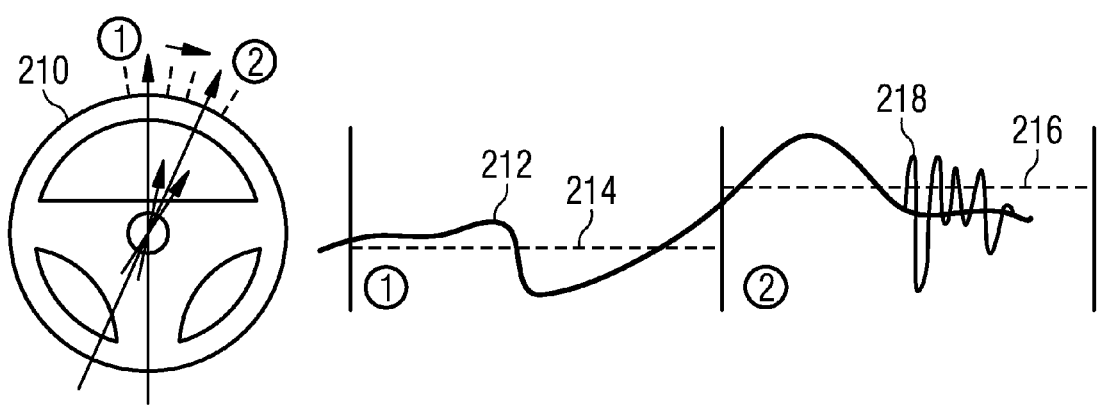
FIG. 2 shows a schematic illustration of a variation of a steering angle over time.

For example, the steering angle of a steering wheel of a vehicle may be detected by a proposed sensor device. FIG. 2 shows an example of a steering wheel 210 and the variation of a steering angle 212 during a first time interval 1 and a second time interval 2. The steering angle does not change so much between one release and the next (e.g. dashed line in time interval 1 indicates a median position 214 and dashed line in time interval 2 indicates next median position 216), for example. Further, oscillations 218 are shown which may be filtered out. For example, a release may be a delivery of an angle value from the sensor to the ECU.

For example, the proposed concept is explained in the context of a steering angle system, as a non-limiting example. However any other system measuring a wanted physical quantity could be considered.

FIG. 3a shows a block diagram of a sensor device according to an embodiment. The sensor device 300 comprises an output parameter generator circuit 350 connected to an input/output interface circuit 340 and a test circuit 360. For example, the sensor device 300 comprises an apparatus according to one of the embodiments or aspects mentioned above (e.g. FIG. 1) or below (e.g. 7). The sensor device 300 may be used for detecting a steering angle of a steering wheel of a vehicle (e.g. FIG. 2).

The output parameter generator circuit 350 may comprise two signal paths for generating two sensor signals. A first signal path of the output parameter generator circuit 350 may comprise a first sensor circuit, a first analog-to-digital converter (ADC) 310, a first multiplexer 312 and a first amplitude offset correction circuit 314. A second signal path of the output parameter generator circuit 350 may comprise a second sensor circuit, a second analog-to-digital converter (ADC) 320, a second multiplexer 322 and a second amplitude offset correction circuit 324. Further, the output parameter generator circuit 350 may comprise an output parameter determiner 330 performing an angle calculation.

The first sensor circuit may comprise four sensing elements 302 (e.g. magnetoresistive structures with at least partly different reference magnetization) arranged in a full bridge configuration (e.g. Wheatstone bridge configuration). The second sensor circuit may comprise four sensing elements 304 (e.g. magnetoresistive structures with reference magnetizations different to the reference magnetizations of the sensing element of the first sensor circuit) arranged in a full bridge configuration (e.g. Wheatstone bridge configuration). The first sensor circuit outputs two half bridge sensor signals indicating a magnitude of a magnetic field component (e.g. oriented in a first direction) occurring at the position of the first sensor circuit. The second sensor circuit outputs two half bridge sensor signals indicating a magnitude of a magnetic field component (e.g. oriented in a second direction) occurring at the position of the second sensor circuit.

The first analog-to-digital converter 310 may generate a first digital sensor signal indicating a difference between the two sensor signals provided by the first sensor circuit. The second analog-to-digital converter 320 may generate a second digital sensor signal indicating a difference between the two sensor signals provided by the second sensor circuit.

The first multiplexer 312 may provide the first digital sensor signal to the first amplitude offset correction circuit 314 during the determination of a current steering angle representing the value of the output parameter. Further, the first multiplexer 312 may provide a first test signal (e.g. test input data or test vector) provided by the test circuit 360 to the first amplitude offset correction circuit 314 during the basic functionality test. The second multiplexer 322 may provide the second digital sensor signal to the second amplitude offset correction circuit 324 during the determination of a current steering angle. Further, the second multiplexer 322 may provide a second test signal (e.g. test input data or test vector) provided by the test circuit 360 to the second amplitude offset correction circuit 324 during the basic functionality test.

The first amplitude offset correction circuit 314 may correct an amplitude offset of the first digital sensor signal and provides a first amplitude corrected digital sensor signal to the output parameter determiner 330. The second amplitude offset correction circuit 324 may correct an amplitude offset of the second digital sensor signal and provides a second amplitude corrected digital sensor signal to the output parameter determiner 330.

The output parameter determiner 330 may calculate a steering angle based on the first amplitude corrected digital sensor signal and the second amplitude corrected digital sensor signal. Further, the output parameter determiner 330 may provide the determined steering angle to the input/output interface circuit 340 for transmission to an external receiver.

The test circuit 360 may initiate the execution of the basic functionality test by switching the first multiplexer 312 and the second multiplexer 322. The test circuit 360 may compare the steering angle provided by the output parameter determiner 330 with a reference signal or reference value to detect an error within one of the two signal paths. In this way, the first amplitude offset correction circuit 314, the second amplitude offset correction circuit 324 and/or the output parameter determiner 330 may be tested during the basic functionality test.

Alternatively, the first multiplexer 312 may be arranged between the first sensor circuit and the first analog-to-digital converter 310 and the second multiplexer 322 may be arranged between the second sensor circuit and the second analog-to-digital converter 320. A corresponding embodiment of a sensor device 370 is shown in FIG. 3b. In this way, the first analog-to-digital converter 310, the second analog-to-digital converter 320, the first amplitude offset correction circuit 314, the second amplitude offset correction circuit 324 and the output parameter determiner 330 may be tested during the basic functionality test.

Further details and aspects are explained in connection with the sensor device shown in FIG. 3a.

Figure 3C:
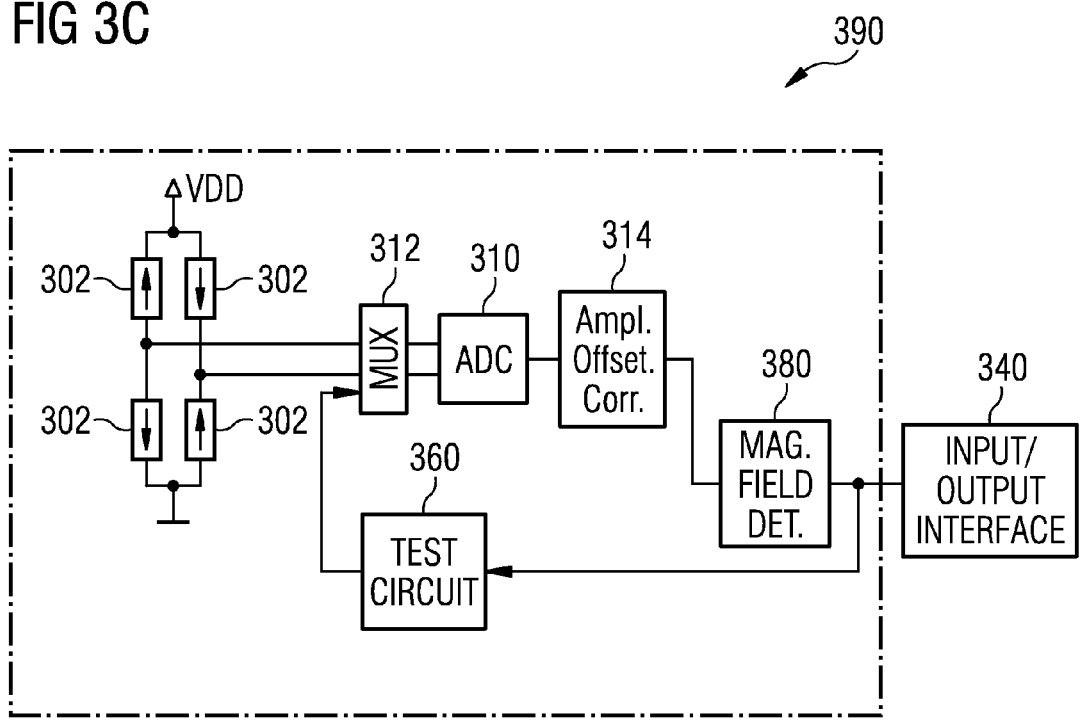
FIG. 3c shows a block diagram of another sensor device.

Additionally, FIG. 3c shows a block diagram of a sensor device 390 for measuring a magnetic field according to an embodiment. The implementation of the sensor device 390 of FIG. 3c is similar to the implementation of the sensor device of FIG. 3b. However, one signal path may be sufficient for the determination of a magnitude of a magnetic field. The sensor device 390 comprises an output parameter generator circuit 350 comprising one signal path for generating a sensor signal. The signal path of the output parameter generator circuit 350 may comprise a sensor circuit, a analog-to-digital converter (ADC) 310, a multiplexer 312 and a magnetic field determiner 380. The sensor circuit, the analog-to-digital converter (ADC) 310 and the first multiplexer 312 may be implemented as explained for the first sensor circuit, the first analog-to-digital converter (ADC) 310 and the first multiplexer 312 of the sensor device 300 shown in FIG. 3a, for example. The magnetic field determiner 380 may calculate a magnitude of a magnetic field existing at the sensor circuit based on the amplitude corrected digital sensor signal. Further, the magnetic field determiner 380 may provide the determined magnetic field to the input/output interface circuit 340 for transmission to an external receiver.

Further details and aspects are explained in connection with the sensor device shown in FIG. 3a and/or FIG. 3b.

One or more mandatory circuit blocks may be tested simultaneously depending on the position where the test input data is feed into the signal path and on the position where the test output data is received from. If more than one circuit block or module is tested or monitored at the same time, it may be difficult to tell which of the tested units is actually faulty. Nevertheless, it may be possible to identify the faulty circuit block by analyzing the test output data, for example.

Alternatively, the test circuit 360 may compare the first amplitude corrected digital sensor signal to the second amplitude corrected digital sensor signal or to reference signals to detect an error within one of the two signal paths.

The output parameter generator circuit 350 may comprise further optional components (e.g. CIC filter circuit, FIR filter circuit).

The sensor device shown in FIG. 3a, FIG. 3b and FIG. 3c was described in connection with the determination of a steering angle or wheel angle. The proposed concept is also applicable to other quantities to be determined (e.g. pressure, temperature) by using other sensing elements and/or more or less signal paths, for example.

Figure 4:
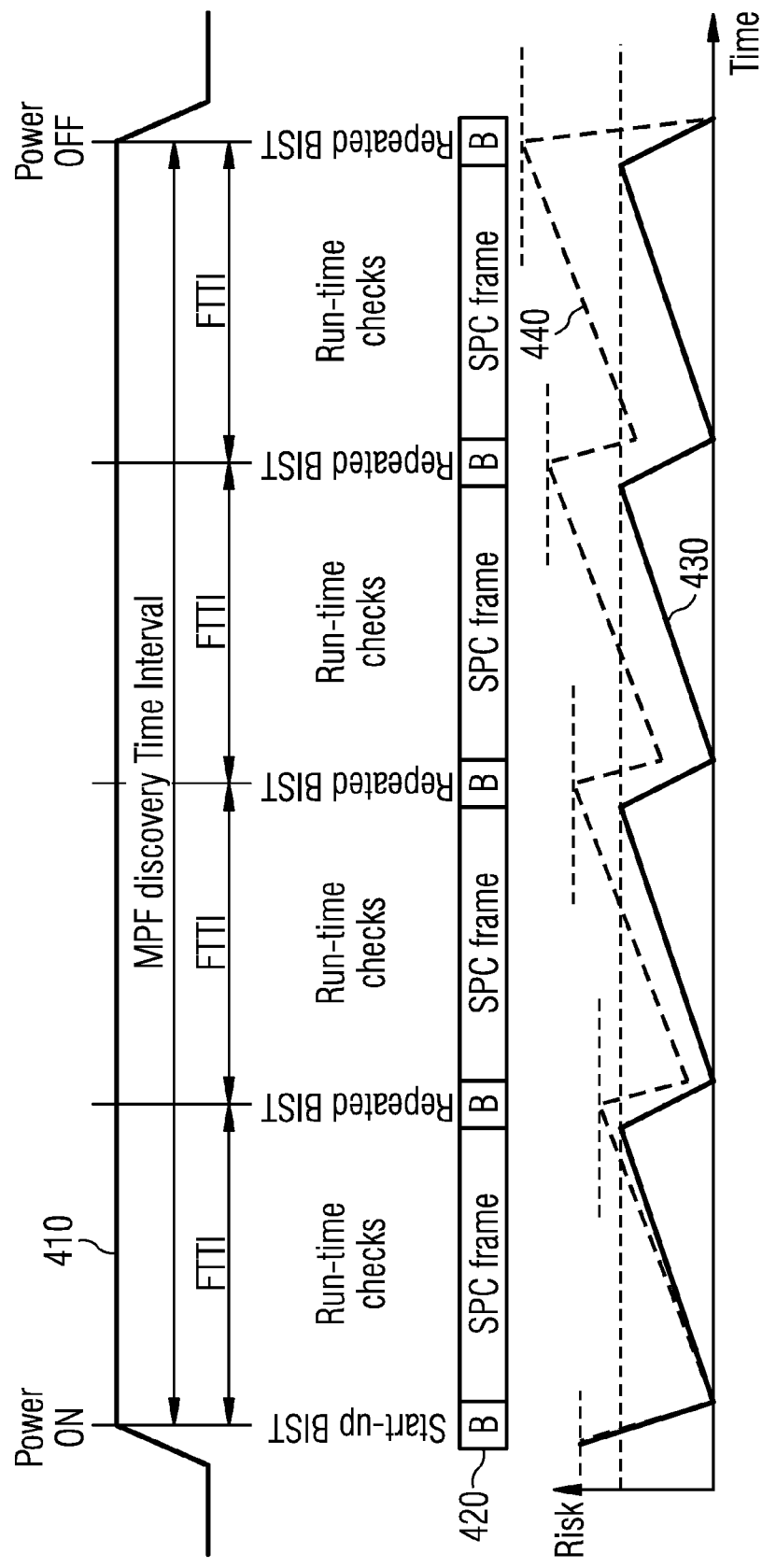
FIG. 4 shows a schematic illustration of a test scheduling and a corresponding development of a failure risk.

The sensor device 300, 370, 390 may use the short pulse width modulation code protocol (SPC) for the transmission of the output parameter. FIG. 4 shows a schematic illustration of a test scheduling and a corresponding development of the failure risk. The power supply 410 of the sensor device over time is shown on top. The time between power on and power off may be the Multiple-Point Fault (MPF) discovery time interval, which may last for several Fault Tolerant Time Intervals (FTTI). The BIST may be repeated after each fault tolerant time interval. One or more SPC frames may be located between the time intervals B blocked for the BIST as indicated by the time line 420. Run-time checks may be done between the BIST tests.

A schematic illustration of the failure risk over time is indicated at the bottom of FIG. 4. The continuous line 430 indicates an example for the risk after implementation of the repeated BIST. The BIST repetition may bring the level of risk down to the very first level after power-up. The dashed line 440 indicates an example for the risk without implementation of the repeated BIST. Only the run-time checks are lowering the risk level, but without reaching again the same level of safety as in the start-up phase, for example. The reason may be that the risk given by the latent faults is accumulating over time and increasing along the power-on time interval.

It may be defined as Fault Tolerant Time Interval (FTTI) the time span within which the run-time mechanisms should discover a fault, flag it and within which the IC may reach a reduced functionality state or a safe operation mode, for example.

For example, as soon as the BISTs are executed within the FTTI, they may also be considered effectively at the same level of run-time mechanisms, thus may allow for a contribution in the reduction of the SPFM FIT rate, too.

For example, to ensure a high LFM value it may be required to restart the IC on a regular basis in order to carry out the specific startup safety mechanisms. The proposed concept may avoid a periodic restart by introducing the BISTs during operation. Thus may lead to a drastic reduction of the LFM FIT rate of the sensor IC and may allow a contribution in the reduction of the SPFM FIT rate, too.

For example, an SPC connected angle sensor delivering an angle every 600 µs upon a constant polling request by the ECU (electronic control unit or engine control unit) may be considered. A FTTI may be set to 600 µs (e.g. 1 SPC frames may be located within one FTTI). At the start-up the BISTs are executed. A reduction of the LFM FIT rate may be accounted.

Figure 5:
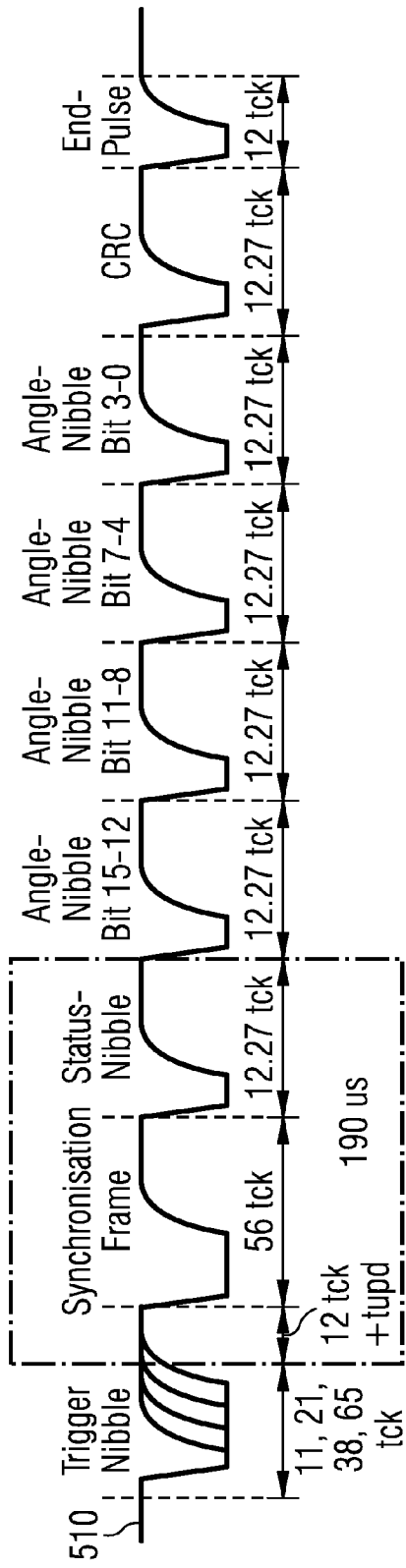
FIGS. 5 and 6 show schematic illustrations of data signals between a sensor device and a control unit.
Figure 6:
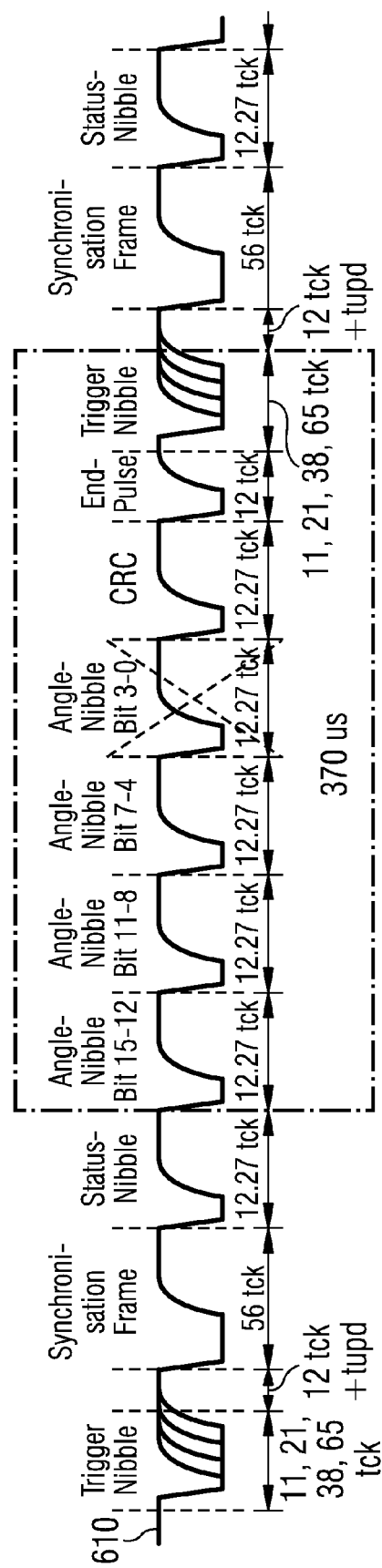

FIGS. 5 and 6 show examples of data signals 510, 610 on a common transmission line used by a sensor device for both, receiving (e.g. trigger signal) and transmitting data (e.g. output parameter). As shown in FIG. 6, the SPC frame may take some microseconds to be delivered. It is possible to use this "dead-time" to re-run the BISTs, for example. In this way it may be possible to benefit of the BISTs FIT rate reduction for the FTTI.

In this example, some IC internal factors may be taken into account to exploit the proposed concept, such as the conversion rate of the ADCs and the delays between the releases of two angles, for example. Those factors may permit the interleaving between the safety checks and the effective angle data acquisition and elaboration (e.g. an interleaving of the test vectors used during BIST and the sensing element/bridge signal can be done if the internal and application timings permit).

For example, assuming a common SPC unit time (tck or ut=2 µs), all calculus can be made in the worst case scenario (e.g. identification ID of the chip still not decoded, shortest nibbles, ECU continuously asking for data)

The available-time calculus and the dead-time calculus (for safety checks) may be done with the following angle sensor parameters. The internal scheduling may run at 25 µs. Further, a SD-ADC (sigma delta ADC) and a CIC (cascaded integrator comb) and a FIR (finite impulse response filter) may have a total conversion-time about 80 µs. Furthermore, a time span before angle delivery may be 190 µs.

After the angle is internally available (e.g. determined by the output parameter generator circuit 350), the CPU may hand-over the transmission task to the SPC interface device and the CPU can deal with safety checks. The more the SD-ADC and CIC filter is not used for sensing the xMR (e.g. giant magnetoresistive sensing element or anisotropic magnetoresistive sensing element), the more time can be used to check itself against the test vectors, for example. Thus it may be possible to switch to the test vectors because a dead-time of 370 µs may be available.

The trigger may happen at the time at which FIG. 5 indicates the beginning of the 190 µs interval. The available time for the BIST may start after the 190 µs interval (e.g. during the output of the angle data, cyclic redundancy check CRC data and an end pulse).

The trigger nibble and the synchronization nibble and the status nibble (respectively 12 ut and 56 ut and 27 ut) may add up to 95 ut=190 µs.

At least a dead-time of 3 nibbles (3*27 ut) and 27 ut and 12 ut and 65 ut of the next frame, equals or equates to 185 ut=370 µs may be available for the BIST test during each SPC frame, for example.

Some embodiments relate to a faults reduction by means of BISTs repetition in angle sensing applications.

For example, to ensure a high LFM value it may be required to restart other ICs on a regular basis in order to carry out the specific startup safety mechanisms. From a user perspective, this may represent a limitation as usually it is difficult to predict how long the chip will be powered-on. Moreover "always-on" applications may be negatively affected, as a user will expect such applications to be always operable.

Some devices may use a mixture of internal and external mechanisms to cover the majority of possible faults and to reduce the FIT rate. Those mechanisms may be run-time measures. They may differ to start-up checks which are may be referred as start-up BISTs (built-in self-tests). The start-up BISTs are not concurring in the FITs reduction for the SPFM, for example. On the other hand, they may reduce the FITs of the LFM. Start-up BISTs may deeply investigate a chip block compared to run-time tests, this because the chip functions are still not fully started (e.g. signal path still not working).

The proposed concept may point out a solution which permits a LFM reduction also in applications with undetermined power-on duration. Furthermore it may lead to a reduction of the SPFM, too.

For example, a steering application may demand the delivery of the angle value of the steering wheel (e.g. often through a gear conversion of the steering shaft or on the actuator motor of the steering mechanisms). The angle may be demanded to be delivered in a synchronous way and by the use of a digital interface e.g. SPC interface. SPC is a digital ECU triggered interface that may becoming a standard bus for actual and future automotive systems, for example.

The synchronous behavior of the polling ECU algorithm for the angle request and the intrinsic slow change of steering angle in automotive steering applications may permit to benefit from the repetition of the start-up BISTs in run-time, and thus may cause a significant reduction of the LFM FIT rate of the sensor IC.

For example, increased safety targets (safety tests in the dead-time because the full signal chain is not used for real angle calculation, ADC, filter, signal path fully checked for drifts also) may be achieved. Further, power may be saved (if sensor or part of it is shut down in the dead-time).

The proposed concept may enable a high level of safety in many applications (e.g. angle sensing applications), for example. If on one hand the ISO development process can assure the compliance to safety, on the other hand the hardware metrics of the chip may address it to an ASIL classification. The more complex the chip is, the more probability of failure is possible. The FIT may be proportional to the area (e.g. chip area or analog area) and FF (e.g. number of digital flip-flops).

To a higher metric classification a lower number of Failures In Time (FIT) is associated. The FIT is a temporal hardware failure identifier and it is dependent on the area of the chip and on the number of residual faults. A residual failure is equivalent to a single-point failure with 0% of diagnostic coverage (so not protected by any mechanisms), for example.

To achieve a high ASIL level, the Single-Point Fault Metric (SPFM) as well as the Latent Fault Metric (LFM) have to reach high values (e.g. >95%), for example. For example, a single-point fault is a fault in an element that is not covered by a safety mechanism and that causes an error and generates a failure. A latent fault may be a multiple-point fault whose presence is not detected by a safety mechanism nor perceived by the controller within the Multiple-Point Fault (MPF) discovery time interval or MPF detection interval, for example.

The proposed concept may avoid a periodic restart by introducing the BISTs during operation. The proposed concept may be implemented for application scenarios of steering and/or a slow interface, for example.

The proposed concept may be applicable to SPC but also any communication protocol on slow channel or a ratio of data Tx (transmit) and BIST time required, for example.

FIG. 7 shows a block diagram of an apparatus for providing an output parameter according to an embodiment. The apparatus 700 comprises a test circuit 720 connected to an output parameter generator circuit 710. The output parameter generator circuit 710 determines a value of an output parameter 712. The output parameter generator circuit 710 comprises at least one mandatory signal path for the determination of a value of the output parameter. Further, the test circuit 720 tests a basic functionality of the at least one mandatory signal path of the output parameter generator circuit repeatedly by providing input test data 722 to an input of the mandatory signal path and analyzing output test data 724 caused by the input test data and received from an output of the mandatory signal path. The test circuit 730 executes the basic functionality test repeatedly after a predefined number of values of the output parameter are determined, at given time intervals or after receiving a trigger, i.e. from an external control unit.

By executing a basic functionality test repeatedly, the reliability and/or the availability of the determination and/or transmission of the output parameter may be increased. The repetition of the basic functionality test may reduce the Latent Fault Metric (LFM), for example.

For example, the at least one mandatory signal path may comprise at least one mandatory circuit block for the determination of a value of the output parameter. For example, the test circuit 720 may compare the output test data 724 with reference test data (e.g. reference signal or reference output vector) or may compare output test date 724 received from a first signal path or during a first time interval with output test date received from a different second signal path or during a different second time interval. In this way, the test circuit 720 may detect an erroneous behavior of the output parameter generator circuit 710.

More details and aspects of the apparatus 700 (e.g. test circuit, output parameter generator circuit, output parameter, basic functionality test) are mentioned in connection with the proposed concept or one or more examples described above (e.g. FIG. 1, 3a, 3b or 3c). The apparatus 700 may comprise one or more additional optional features corresponding to one or more aspects of the proposed concept or one or more examples described above or below.

FIG. 8 shows a flow chart of a method for providing an output parameter according to an embodiment. The method 800 comprises determining 810 a value of an output parameter repeatedly by an output parameter generator circuit comprising at least one circuit block mandatory for the determination of a value of the output parameter. Further, the method 800 comprises transmitting 820 the output parameter repeatedly to a receiver and testing 830 a basic functionality of the at least one mandatory circuit block of the output parameter generator circuit repeatedly. The at least one mandatory circuit block of the output parameter generator circuit is unavailable for the determination of a value of the output parameter during the basic functionality test.

By executing a basic functionality test repeatedly, the reliability and/or the availability of the determination and transmission of the output parameter may be increased.

The method 800 may comprise one or more additional optional features corresponding to one or more aspects of the proposed concept or one or more examples described above.

FIG. 9 shows a flow chart of a method for providing an output parameter according to an embodiment. The method 900 comprises determining 910 a value of an output parameter by an output parameter generator circuit comprising at least one mandatory signal path, namely mandatory for the determination of a value of the output parameter. Further, the method 900 comprises testing 920 a basic functionality of the at least one mandatory signal path of the output parameter generator circuit repeatedly by providing input test data to an input of the mandatory signal path and analyzing output test data caused by the input test data and received from an output of the mandatory signal path. The basic functionality test is executed repeatedly after a predefined number of values of the output parameter are determined, at equal time intervals or after receiving a trigger from an external control unit.

By executing a basic functionality test repeatedly, the reliability and/or the availability of the determination and transmission of the output parameter may be increased.

The method 900 may comprise one or more additional optional features corresponding to one or more aspects of the proposed concept or one or more examples described above.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. An apparatus for providing an output parameter, the apparatus comprising:
   an output parameter generator circuit configured to generate a value of an output parameter, based on a sensor signal output from a sensor element indicating a magnitude of a physical quantity to be sensed, repeatedly, wherein the output parameter generator circuit includes at least one mandatory circuit block required to determine the value of the output parameter based on the sensor signal;
   an output interface circuit configured to transmit the value of the output parameter, determined based on the sensor signal, that is repeatedly generated; and
   a test circuit configured to execute a basic functionality test, based on a test signal, to test a basic functionality of the at least one mandatory circuit block of the output parameter generator circuit repeatedly,
      wherein the basic functionality test is initiated based on selecting the test signal in place of the sensor signal, and
      wherein the at least one mandatory circuit block of the output parameter generator circuit is unavailable to determine another value of the output parameter, based on the sensor signal, during the basic functionality test due to the test signal being selected in place of the sensor signal.

2. The apparatus according to claim 1, wherein the test circuit is configured to execute the basic functionality test during a transmission of the output parameter.

3. The apparatus according to claim 1, wherein the test circuit is configured to execute the basic functionality test repeatedly after a predefined number of values of the output parameter are transmitted.

4. The apparatus according to claim 1, wherein the test circuit is configured to execute the basic functionality test repeatedly at equal time intervals.

5. The apparatus according to claim 1, wherein the test circuit is configured to repeat the basic functionality test at a repeated time interval, wherein the repeated time interval comprises a length between 1 ms and 50 ms.

6. The apparatus according to claim 1, wherein the test circuit is configured to test the basic functionality of the at least one mandatory circuit block of the output parameter generator circuit repeatedly while the apparatus is in an uninterrupted power-on state.

7. The apparatus according to claim 1, wherein the test circuit is configured to test a run time functionality of the at least one mandatory circuit block of the output parameter generator circuit repeatedly, wherein the at least one mandatory circuit block of the output parameter generator circuit is available to determine the value of the other output parameter during a test of the run time functionality.

8. The apparatus according to claim 1, wherein the basic functionality test is a built-in self-test.

9. The apparatus according to claim 1, wherein the output parameter generator circuit comprises at least one mandatory signal path required to determine the value of the output parameter, wherein the test circuit is configured to test the basic functionality of the at least one mandatory signal path of the output parameter generator circuit by providing input test data to an input of the at least one mandatory signal path.

10. The apparatus according to claim 9, wherein the test circuit is configured to analyze output test data caused by the input test data and received from an output of the at least one mandatory signal path.

11. The apparatus according to claim 10, wherein the test circuit is configured to compare the output test data with reference test data.

12. The apparatus according to claim 1, wherein the physical quantity is a magnetic field or a pressure.

13. The apparatus according to claim 1, wherein the output parameter generator circuit comprises an analog-to-digital converter configured to generate a digital sensor signal based on the sensor signal provided by the sensor element, wherein the output parameter generator circuit comprises filter circuitry configured to generate a filtered sensor signal based on the digital sensor signal, wherein the output parameter generator circuit comprises an output parameter determiner configured to provide a value of the output parameter to the output interface circuit based on the filtered sensor signal.

14. The apparatus according to claim 13, wherein the test circuit is configured to test a basic functionality of one or more of the analog-to-digital converter, the filter circuitry, or the output parameter determiner.

15. The apparatus according to claim 1, further comprising an input interface circuit configured to receive a trigger signal, wherein the output interface circuit is configured to transmit the output parameter based on the trigger signal.

16. The apparatus to claim 15, wherein the input interface circuit is configured to receive the trigger signal through a common transmission line, wherein the output interface circuit is configured to transmit the output parameter through the common transmission line.

17. The apparatus according to claim 1, wherein the output interface circuit is configured to transmit the output parameter based on a short pulse width modulation code protocol.

18. An apparatus for providing an output parameter, the apparatus comprising:
   an output parameter generator circuit configured to generate a value of an output parameter based on a sensor signal output from a sensor element indicating a magnitude of a physical quantity to be sensed,
      wherein the output parameter generator circuit comprises at least one mandatory signal path required to determine the value of the output parameter based on the sensor signal; and
   a test circuit configured to execute a basic functionality test, based on input test data, to test a basic functionality of the at least one mandatory signal path of the output parameter generator circuit repeatedly by providing input test data to an input of the at least one mandatory signal path and analyzing output test data caused by the input test data and received from an output of the at least one mandatory signal path,
      wherein the basic functionality test is initiated based on selecting the input test data to input to the mandatory signal path in place of the sensor signal, and
      wherein the test circuit is configured to execute the basic functionality test repeatedly after a predefined number of values of the output parameter are determined, after equal time intervals, or after receiving a trigger from an external control unit.

19. The apparatus of claim 18, wherein the physical quantity is a magnetic field or a pressure.

20. The apparatus of claim 18, wherein the test circuit is configured to execute the basic functionality test repeatedly after the predefined number of values of the output parameter are determined.

* * * * *